US 12,418,296 B1

United States Patent
Fertig et al.

(10) Patent No.: US 12,418,296 B1
(45) Date of Patent: Sep. 16, 2025

(54) MODE ENGINEERED LOOP GAP RESONATOR ENCLOSURE FOR ATOMIC SENSING

(71) Applicant: Honeywell International Inc., Charlotte, NC (US)

(72) Inventors: Chad Fertig, Roseville, MN (US); Luke Horstman, Saint Louis Park, MN (US); Charles Rhoads, North Hollywood, CA (US)

(73) Assignee: Honeywell International Inc., Charlotte, NC (US)

( * ) Notice: Subject to any disclaimer, the term of this patent is extended or adjusted under 35 U.S.C. 154(b) by 2 days.

(21) Appl. No.: 18/604,254

(22) Filed: Mar. 13, 2024

(51) Int. Cl.
*H03L 7/26* (2006.01)
*G04F 5/14* (2006.01)

(52) U.S. Cl.
CPC . *H03L 7/26* (2013.01); *G04F 5/14* (2013.01)

(58) Field of Classification Search
CPC .......................................... H03L 7/26
USPC .......................................... 331/94.1
See application file for complete search history.

(56) References Cited

U.S. PATENT DOCUMENTS

| | | | | |
|---|---|---|---|---|
| 2005/0017720 A1* | 1/2005 | Mett | ................. | G01R 33/30 324/321 |
| 2005/0088248 A1 | 4/2005 | White | | |
| 2015/0022273 A1* | 1/2015 | Fertig | ................. | G04F 5/14 29/600 |

FOREIGN PATENT DOCUMENTS

| | | |
|---|---|---|
| CN | 213581763 U | 6/2021 |
| EP | 2629158 A1 | 8/2013 |
| KR | 100280871 B1 | 3/2001 |
| KR | 100351330 B1 | 9/2002 |
| WO | 2017107307 A1 | 6/2017 |

OTHER PUBLICATIONS

Su et al., "Mode Suppression and Homogeneous Field Bandwidth Enhancement of a Tuning-Free Micro-Loop-Gap Resonator Using FR4 for Chip-Scale Rubidium Clock", IEEE Transactions on Microwave Theory and Techniques, as downloaded Jan. 13, 2024 from IEEE Xplore, pp. 1 through 11.
Violetti, et al., "The Microloop-Gap Resonator: A Novel Miniaturized Microwave Cavity for Double-Resonance Rubidium Atomic Clocks", IEEE Sensors Journal, vol. 14, No. 9, Sep. 2014, pp. 3193 through 3200.
European Patent Office, "Extended European Search Report", dated Jun. 16, 2025, from EP Application No. 24223323.7, from Foreign Counterpart to U.S. Appl. No. 18/604,254, pp. 1 through 8, Published: EP.

* cited by examiner

*Primary Examiner* — Joseph Chang
(74) *Attorney, Agent, or Firm* — Fogg & Powers LLC

(57) ABSTRACT

A housing for coupling to a loop gap resonator (LGR) includes an interior cavity in which the LGR is disposed therein. The LGR is attached to the housing by at least one mounting bracket, which fixes the LGR in the interior cavity. Additionally, the interior cavity includes a separation region between the cavity walls and the LGR. The widths of each mounting bracket and the width of the separation region is determined in order to support a uniform electromagnetic field inside the LGR.

20 Claims, 4 Drawing Sheets

MODE ENGINEERED LOOP GAP RESONATOR ENCLOSURE FOR ATOMIC SENSING

STATEMENT REGARDING FEDERALLY SPONSORED RESEARCH OR DEVELOPMENT

This invention was made with Government support under N00014-22-C-1043 awarded by Navy. The Government has certain rights in the invention.

BACKGROUND

Miniature atomic sensors such as atomic clocks require atoms to interact with microwave fields with a highly homogeneous spatial phase profile to ensure accuracy in critical sensing applications, one of which is timing holdover in Global Navigation Satellite Systems (GNSS) denied environments. However, small spatial gradients in phase can result in substantial clock errors, thereby degrading sensor performance. One advantageous mechanism for producing microwave fields in laser cooled atomic clocks is the loop gap resonator (LGR). Even so, the LGR is not immune to effects from spatial gradients to its supported electromagnetic resonance modes. For example, an electromagnetic resonance mode in the LGR can be deleteriously modified by the structure of the LGR or from its surrounding environment. Even the coupling of the LGR in an external housing designed to insulate the LGR can introduce perturbations to the resonance modes, and can destabilize the LGR.

Therefore, a need exists to improve the isolation of electromagnetic resonance modes generated in an LGR.

SUMMARY

The details of one or more embodiments are set forth in the summary and description below. The features illustrated or described in connection with one exemplary embodiment may be combined with the features of other embodiments. Thus, any of the various embodiments described herein can be combined to provide further embodiments. Aspects of the embodiments can be modified, if necessary to employ concepts of any various patents, applications and publications as identified herein to provide yet further embodiments.

In one embodiment, a device is disclosed. The device comprises a housing coupled to a loop gap resonator (LGR). The LGR includes an inner cavity and is configured to support an electromagnetic field in the inner cavity. The housing comprises an exterior, and an interior. The interior comprises an interior cavity in which the LGR is disposed therein. The housing comprises at least one mounting bracket protruding into the interior cavity. The at least one mounting bracket has a first width and is configured to fix the LGR in the interior cavity of the housing. The LGR is fixed by the at least one mounting bracket so that there exists a separation region between an outer edge of the LGR and an inner edge of the housing. The separation region has a second width. Based on the first width of the at least one mounting bracket, and the second width of the separation region, an electromagnetic field of substantially uniform phase and amplitude is provided in the inner cavity of the LGR.

In another embodiment, a system is disclosed. The system comprises a signal generator configured to couple an electromagnetic signal in a loop gap resonator (LGR). The LGR includes an inner cavity and is configured to receive the electromagnetic signal and to generate an electromagnetic field in the inner cavity. The system comprises a housing coupled to the LGR. The housing comprises an exterior, and an interior. The interior comprises an interior cavity in which the LGR is disposed therein. The housing comprises at least one mounting bracket protruding into the interior cavity. The at least one mounting bracket has a first width and is configured to fix the LGR in the interior cavity of the housing. The LGR is fixed by the at least one mounting bracket so that there exists a separation region between an outer edge of the LGR and an inner edge of the housing. The separation region has a second width. Based on the first width of the at least one mounting bracket, and the second width of the separation region, an electromagnetic field of substantially uniform phase and amplitude is provided in the inner cavity of the LGR.

In yet another embodiment, a method is disclosed. The method comprises determining dimensions of at least one mounting bracket and a separation region. The dimensions of the at least one mounting bracket include a first width, and the dimensions of the separation region include a second width. The method comprises fabricating the at least one mounting bracket, wherein the at least one mounting bracket is coupled to a housing and protrudes into an interior cavity of the housing. The method comprises coupling a loop gap resonator (LGR) to the at least one mounting bracket. The LGR includes an inner cavity and is configured to generate an electromagnetic field in a region of free space in the inner cavity. The LGR is disposed into the interior cavity of the housing such that the second width of the separation region separates the LGR from the housing. The method comprises inputting an electromagnetic signal into the LGR. The method comprises exciting a desired electromagnetic mode at a resonance frequency in the inner cavity of the LGR from the electromagnetic signal.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, as subsequently described and in conjunction with the detailed description.

In accordance with common practice, the various described features are not drawn to scale but are drawn to emphasize features relevant to the exemplary embodiments.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Figure 1:
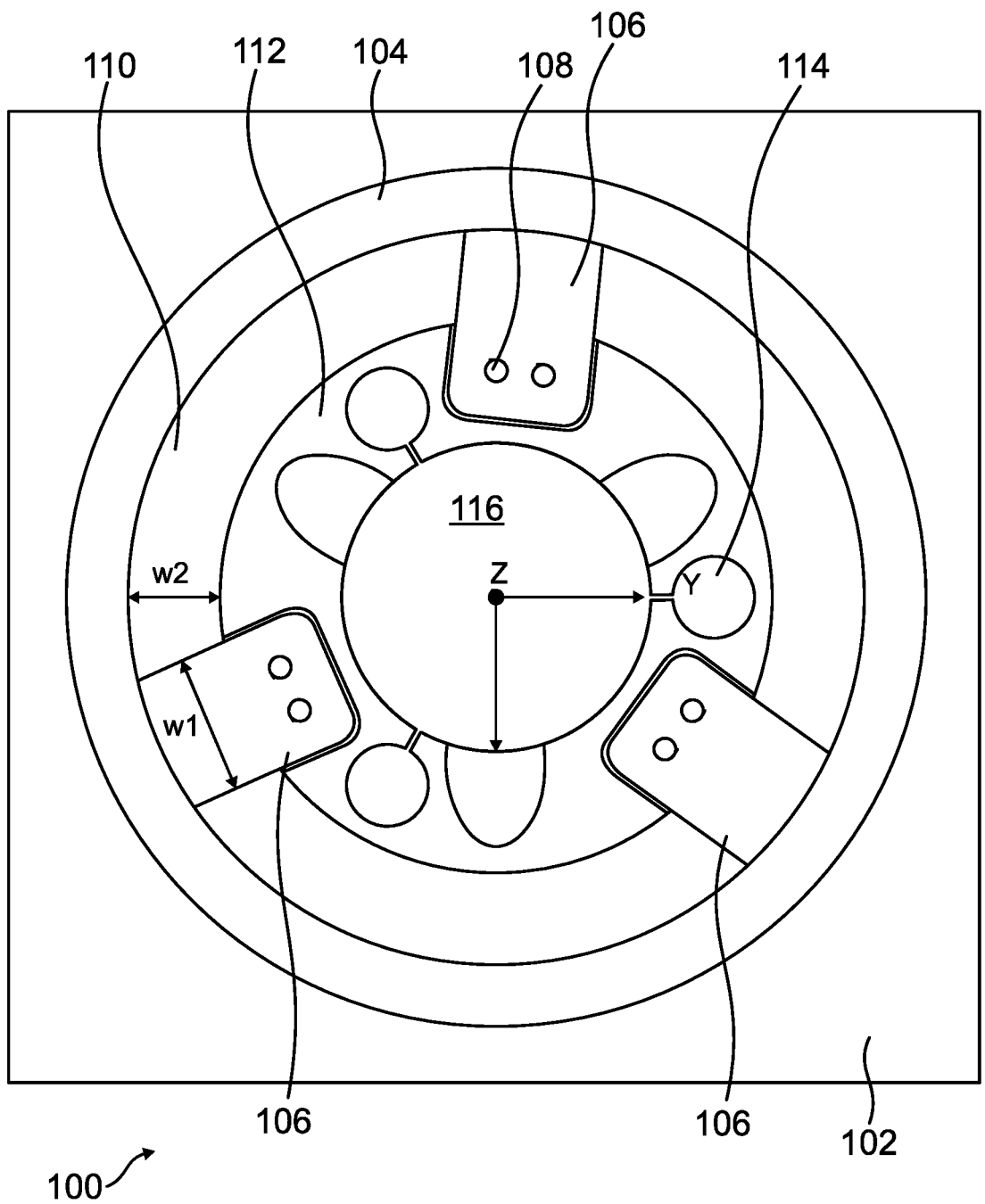
FIG. 1 depicts a top view of an LGR enclosed in a housing, as described in one or more embodiments.

FIG. 1 depicts a top view of an LGR 112 enclosed in a housing 100, which as further described, can form part of an atomic sensor such as a miniature atomic clock. Housing 100 is defined by a base 102 and an interior cavity that encloses the LGR 112. In the embodiment in FIG. 1, the base 102 has a rectangular length and width so that in three-dimensional space, the housing 100 is approximately cubical in shape (see FIGS. 2A-2C). Generally, the housing comprises a metal or other conductor. In some atomic sensing applications, the LGR 112 has electromagnetic modes in the microwave region of the electromagnetic spectrum; hence, the base 102 can comprise a material that alters the propagation electromagnetic fields and corresponding resonant modes in the LGR 112. Depending on its material composition, the base 102 may function as an electromagnetic insulator in which electromagnetic fields do not propagate in the base 102.

The interior cavity of the housing 100 includes a volume designed to enclose the LGR 112. In the embodiment of FIG. 1, the interior cavity is cylindrical, with its radius defined by the interior surface of an interior wall 104 (which can be made of the same material as the surrounding base 102). Depending on the geometry of the LGR 112 and the desired electromagnetic resonance modes supported therein, the interior cavity can be made of other shapes as well. Besides the LGR 112, in various examples the interior cavity is filled with a gas or vacuum. However, the interior cavity may also be filled with an insulating material, such as a dielectric glass or dielectric ceramic.

In the embodiment of FIG. 1, the LGR 112 is disposed in the interior cavity of the housing 100 so that it is concentric with respect to the interior wall 104 that defines the interior cavity. LGR 112 is generally configured to support electromagnetic field modes at one or more resonant frequencies (resonant modes). Although not shown in FIG. 1, the LGR 112 (and the housing 100) is coupled via transmission lines to a source of electromagnetic energy, thereby exciting one or more electromagnetic modes of the LGR 112. Specifically, the LGR 112 includes an inner cavity 116 that can be filled with a gas or vacuum or a dielectric insulating material. In some embodiments, one or more resonant modes of the LGR 112 have a large amplitude in the volume of the inner cavity 116. In some applications, it is important to excite only one mode, and to suppress the excitation of other modes which have large amplitudes in the inner cavity 116. The housing 100 is designed to promote the excitation of one desired mode, and to suppress the excitation of un-desired modes, in the inner cavity 116. The electromagnetic mode resonating in inner cavity 116 preferably have substantially uniform phase and amplitude to improve the accuracy of atomic sensing measurements utilizing signals generated from this mode.

As shown in FIG. 1, LGR 112 is comprised of at least one or more through-holes 114 in the axial direction (into the page) connected by at least one or more through-gaps in the axial direction (into the page). These holes 114 act as the outer cavities of the LGR 112, for which an electromagnetic signal received by the LGR 112 can be coupled into the inner cavity 116 (e.g., through conductive coils around the holes 114). Additionally, LGR 112 can have pits, indentations, axial blind holes, radial blind holes, radial through-holes, or other surface features. The number, shape, and dimensions of the holes and gaps, together with other aspects of the geometry of the LGR, determine a spectrum of resonant modes. Detailed operation and functionality of LGR 112 is omitted for brevity, and is familiar to one of ordinary skill in the art.

When coupled to a signal generator, the LGR 112 can support electromagnetic modes in the inner cavity 116. Some of the modes supported by the LGR 112 have energy that enables propagation outside of the walls of the inner cavity 116. As a result, the desired electromagnetic modes supported by the LGR may not be adequately isolated from other electromagnetic fields.

LGR 112 is physically coupled to housing 100 via one or more mounting brackets 106 (three of which are shown in FIG. 1). Each mounting bracket 106 protrudes outward from the interior wall 104 to a respective contact 108 on the surface of LGR 112. In some embodiments, each mounting bracket 106 includes one or more male contacts that physically couple to a respective female contact 108 on LGR 112. However, the contacts 108 on the LGR 112 can also comprise male contacts to couple to female contacts on the mounting brackets 106. Each mounting bracket 106 can physically couple to the LGR 112 via screws, bolts, nuts, and other couplers. In the embodiment of FIG. 1, LGR 112 includes respective grooves on the top exterior surface in which the contacts 108 are disposed on. The grooves match the spatial dimensions of the protruding ends of each corresponding mounting bracket 106 so that the respective mounting bracket 106 "fits" into a groove. While each mounting bracket 106 can attach to the surface of LGR 112 (namely, the top surface as shown in FIG. 1), in some embodiments, the mounting brackets 106 may have a volume (extending into the page of FIG. 1) that couple to one or more contacts 108 disposed on an appropriate receiving surface of the LGR 112.

Each mounting bracket 106 can be made of the same material as the interior wall 104 and/or the base 102. When multiple mounting brackets 106 are used, they can extend azimuthally equidistant from each other as shown in FIG. 1 to the LGR 112. Each mounting bracket 106 protrudes a sufficient length from the interior wall 104 into the interior cavity to physically couple to the LGR 112. Additionally, each mounting bracket 106 includes a width w1 as shown in FIG. 1. Although the width of each mounting bracket 106 is described pedagogically is identical (w1), in general the width of each mounting bracket 106 can differ in a specific embodiment.

The LGR 112 rests within the inner cavity coupled by mounting brackets 106 such that it is separated from the interior wall 104. This creates a separation region 110 (alternatively, "guard ring 110" or "gap 110") between the interior wall 104 and the LGR 112 having a width w2. Separation region 110 includes a width w2 independent of the width w1 of the mounting brackets 106 (although w1 can equal w2). Separation region 110 can be filled with vacuum, gas(es), and/or dielectric materials such as glass, ceramic, or plastic. In some embodiments, electromagnetic waves may propagate in the separation region 110. These electromagnetic waves are considered auxiliary to those in the inner cavity 116, in the resonance modes of the LGR 112.

The specific implementation of the housing 100 is driven by an advantage to suppress the excitation of electromagnetic modes other than the desired modes in the inner cavity 116. Thus, the specific spatial parameters of the housing 100, including the geometry of the interior cavity, the width w2 of the separation region 110, the width w1 of each mounting bracket 106, and others, are modeled in order to establish a configuration that promotes the excitation of the desired electromagnetic modes in the inner cavity 116. For example, one or more processors, processing circuitry, and the like (not shown) can be configured to execute a modeling application that predicts the characteristic profile of the resonance modes of the electromagnetically coupled system comprising LGR 112 and housing 100, including modelling of the spatial characteristics of the electromagnetic field in the inner cavity 116. Exemplary modeling applications that can be used include numerical approximation techniques to solve Maxwell's equations, such as finite element modeling. The processors implementing the modeling application can then generate a model of the resonance modes based on parameters including the number, dimension, and position of the through-holes and through-holes in LGR112, the number, position, and width w1 of each mounting bracket 106 that couples to the LGR 112, and the width w2 of the separation region between the LGR 112 and the interior wall 104. In modeling the resonance modes, the width w1 of each mounting bracket 106 and the width w2 of the separation region 110 can be designed to achieve an electromagnetic field in the inner cavity 116 that is at a specific resonance frequency which exhibits substantially uniform phase and amplitude. Said another way, the width w1 of the mounting brackets 106 and the width w2 of the separation region 110 can be modeled to optimize the electromagnetic field inside the inner cavity 116 by suppressing the excitation of un-desired modes. Once the number, position, and widths w1 and w2 of each mounting bracket are determined, the housing 100 can be fabricated with these parameters using conventional techniques.

Figure 2A:
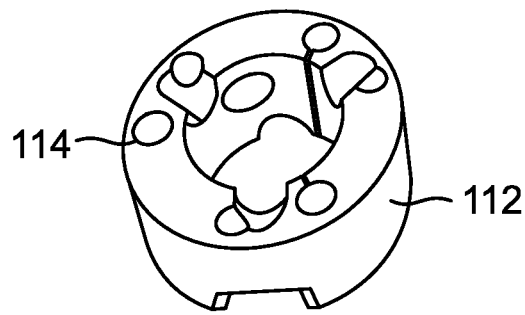
FIGS. 2A-2C depict various isometric views of an LGR (FIG. 2A), housing (FIG. 2B), and enclosure (FIG. 2C), as described in one or more embodiments.
Figure 2B:
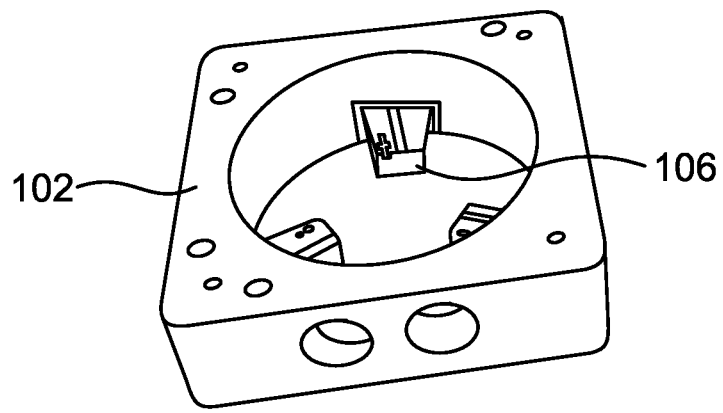
Figure 2C:
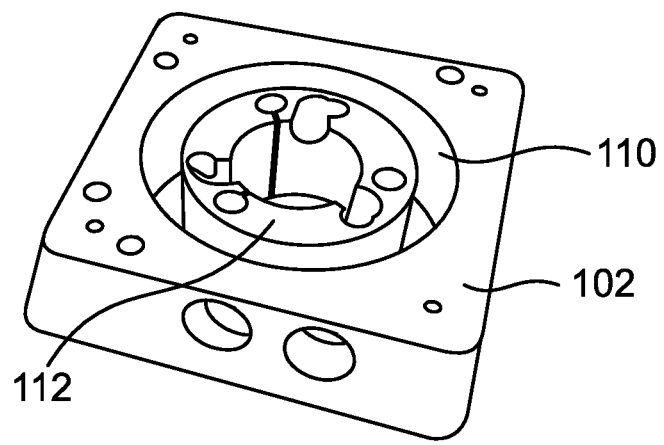

FIGS. 2A-2C depict various isometric views of components of an atomic sensing circuit. Specifically, FIG. 2A depicts an isometric view of an embodiment of the LGR 112 described in FIG. 1, FIG. 2B depicts an isometric view of an embodiment of the housing 100 described in FIG. 1 (without the LGR 112), and FIG. 2C depicts an isometric view of an embodiment of an enclosure comprising the housing 100 and the LGR 112 disposed therein. The LGR 112 depicted in FIGS. 2A-2C is exemplary and may have different dimensions and cavity properties than as depicted in these figures.

Referring first to FIG. 2A, LGR 112 is cylindrical having a bottom surface in which a plurality of holes 114 are fabricated through, as well as one or more grooves that can be etched onto the surface. The LGR 112 can be fabricated using conventional manufacturing techniques.

Referring next to FIG. 2B, housing 100 occupies a cubical shape with a cylindrical interior cavity in the center. Three mounting brackets 106 protrude into the interior cavity. Each mounting bracket 106 physically couples to a contact point on LGR 112 (not shown) via screws, bolts, or other connectors.

In FIG. 2C, LGR 112 is coupled with the interior cavity of the housing 100 by the three mounting brackets 106 (not shown). Coupling the LGR 112 to the mounting brackets 106 in this way creates a separation region 110, which can be filled with a gas, vacuum, or in some embodiments an electromagnetic dielectric material. In some embodiments, the spatial dimensions of the housing 100 are 3 centimeters by 3 centimeters by 1 centimeter. Although not shown in FIG. 2C, the housing 100 may be covered on top and bottom. When coupled to an electromagnetic field generator (see FIG. 3), LGR 112 supports a uniform phase and magnitude electromagnetic field within the central inner cavity 116. This is the desirable field. However, depending on some implementations, other undesirable electromagnetic modes may be supported in the central inner cavity 116 as well as the surrounding space of the interior cavity, such as the separation region 110, and the surrounding environment where the housing 100 resides. Based on the width of the mounting brackets 106 used to couple the LGR 112 to the housing, and the width of the separation region 110, the housing 100 is designed to keep the phase and amplitude of the electromagnetic field uniform in the central inner cavity 116. For example, the design of the housing 100 can shift the frequency or spatial structure or quality factor of un-desired modes to mitigate the impact of these undesirable modes in the field in the inner cavity 116.

Figure 3:
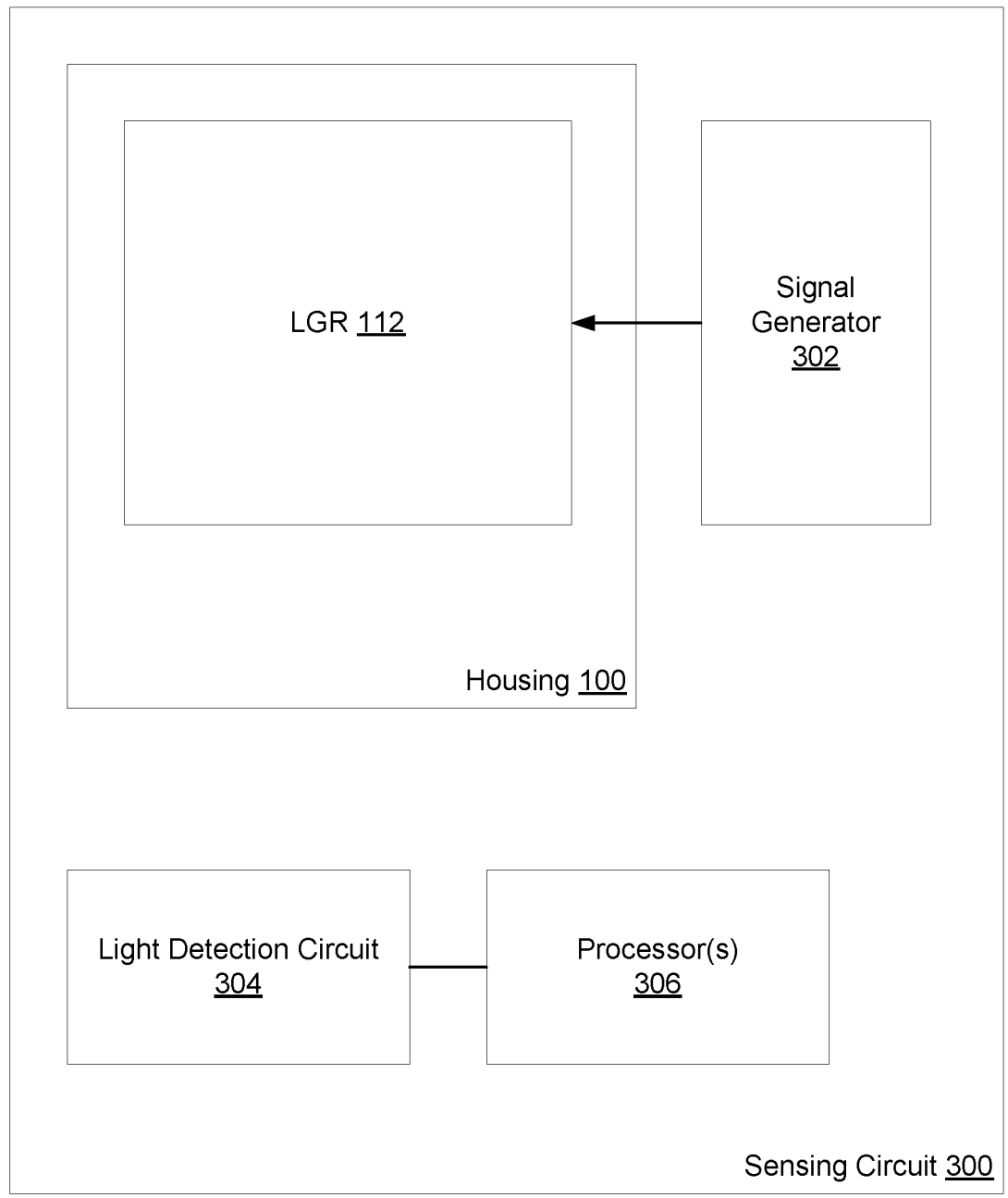
FIG. 3 depicts a block diagram of a sensing circuit incorporating the enclosure of FIGS. 1-2, as described in one or more embodiments.

FIG. 3 depicts a block diagram of a sensing circuit 300 incorporating the enclosure of FIGS. 1-2. Sensing circuit 300 can be implemented as an atomic clock or more generally as an atomic sensor. Sensing circuit 300 generally includes a housing 100 including LGR 112, a signal generator 302 delivering electromagnetic energy in the RF to microwave frequency range, and a light detection circuit 304 coupled to one or more processors 306. Sensing circuit 300 may include other components than those explicitly shown in FIG. 3.

Signal generator 302 generates an electromagnetic signal that is input into the housing 100 and induced to the inner cavity 116 of the LGR 112 via coupling to the outer cavities 114 of the LGR 112. For example, signal generator 302 can include a synthesizer or other signal source that generates an electromagnetic signal in the RF to microwave range of the electromagnetic spectrum. The signal emitted by signal generator 302 is coupled to the LGR 112 via a transmission line or other electromagnetic waveguide to one or more conductive loops covering the outer cavities 114 of the LGR 112. The signal so coupled excites one or more electromagnetic resonance modes in the LGR 112, and in doing so the LGR 112 generates an electromagnetic field in the volume of the inner cavity 116. As previously described, the LGR 112 is physically mounted to the housing 100 by one or more mounting brackets 106, and the LGR 112 is separated from the walls of the housing 100 by a separation region 110. Based on the width of the mounting brackets 106 and the width of the separation region 110, the electromagnetic field excited in the LGR 112 is one of a desired mode, whereas un-desired modes are substantially suppressed. A numerical model (e.g., a finite element analysis model) can be used to determine the widths of the mounting brackets 106 and separation region 110 before fabrication that satisfy the desired condition that the desired resonant modes of the LGR 112 are excited, and the un-desired modes are not excited.

To operate as an atomic clock, a source of atoms such as Rubidium can be deposited into the inner cavity 116 of the LGR. Upon interacting with the desired isolated electromagnetic field in the inner cavity 116, the Rubidium atoms can excite at a resonance frequency. This frequency can serve as the basis for an atomic clock reference signal. To detect the resonant frequency of the Rubidium atoms, light detection circuit 304 monitors the LGR 112 and receives electromagnetic signals at the resonance frequency. One or more processor(s) 306 can use the detected electromagnetic signals at the resonance frequency to serve as a reference clock measurement.

Figure 4:
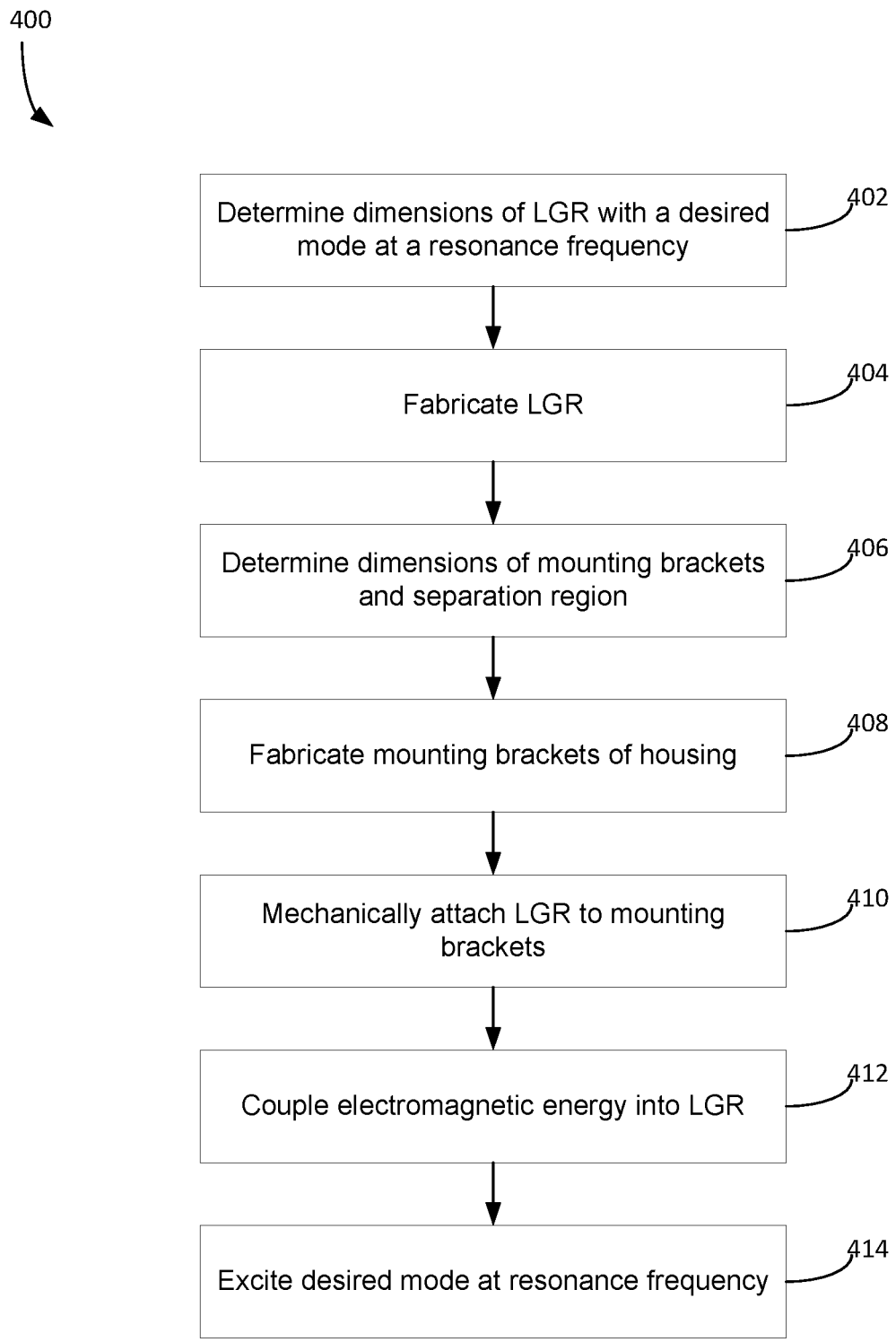
FIG. 4 depicts a flow diagram of a method for fabricating an electromagnetic device, as described in one or more embodiments.

FIG. 4 depicts a flow diagram of a method 400 for fabricating an electromagnetic device, including the housing 100 and LGR 112 as described in conjunction with FIGS. 1-3. Method 400 may be implemented via the techniques described with respect to FIGS. 1-3, but may be implemented via other techniques as well. The blocks of the flow diagram have been arranged in a generally sequential manner for ease of explanation; however, it is to be understood that this arrangement is merely exemplary, and it should be recognized that the processing associated with the methods described herein (and the blocks shown in the Figures) may occur in a different order (for example, where at least some of the processing associated with the blocks is performed in parallel and/or in an event-driven manner).

Method 400 includes determining dimensions of an LGR with a desired mode at a resonance frequency at block 402. The dimensions of the LGR can be determined using finite element modelling or other numerical analysis, based on a desired mode that will be supported in the inner cavity of the LGR. In an atomic clock implementation, this desired mode will be used to excite atoms at the resonance frequency. Block 402 can be performed by one or more processors executing a modelling application. At block 404, the LGR is fabricated based on the analysis conducted in block 402, so that the LGR has the dimensions to support the desired mode. Block 404 can be performed by conventional manufacturing techniques.

Method 400 determines dimensions of the mounting brackets and separation region that comprise the housing at block 406. For example, one or more processors can execute a finite element model or other numerical scheme that uses various properties of the LGR and the housing to determine the width w1 of each mounting bracket and w2 of the separation region for a desired electromagnetic field supported by the LGR. In some embodiments, the mounting brackets may differ in number and dimensions, which may be advantageous in generating a desired electromagnetic mode from the LGR that is uniform in phase and amplitude. Additionally, the dimensions of the LGR and/or the interior cavity of the housing may be known; these quantities may also be used in determining the appropriate width w2 of the separation region. However, only the dimensions of the LGR may be known if the housing complex has not yet been fabricated. In this case, the interior cavity of the housing can then be fabricated to achieve the separation gap width w2 that is determined in block 402.

At block 408, method 400 proceeds by fabricating at least one mounting bracket of the housing. At this point the widths w1 of each mounting bracket are known from the numerical analysis conducted at block 406, and the mounting brackets can be then fabricated based on those widths. Conventional fabrication processes can be used in coupling the mounting brackets to the base of the housing so that each mounting bracket protrudes into the interior cavity, as shown in FIG. 1.

Proceeding to block 410, method 400 mechanically attaches the LGR to the mounting brackets of the housing. As shown in FIG. 1, the LGR is disposed in the interior cavity of the housing and is separated from the interior wall of the cavity by a separation gap, the width of which is determined from block 406. The LGR can be mechanically attached to the ends of each mounting bracket as shown in FIG. 1 by one or more contact points. In various examples, screws, nuts, bolts, and other connectors can be used to couple the mounting brackets to the LGR. In some embodiments, the separation region can then be filled with an insulating material that shields the LGR from electromagnetic or vibrational effects.

The housing complex including the housing and the enclosed LGR can then be used in a sensing circuit as described in FIG. 3. Accordingly, method 400 proceeds to block 412 and couples electromagnetic energy into the LGR, for example, by a signal generator coupled to the LGR via one or more transmission lines. Such energy induces a resonant mode of the LGR, exciting an electromagnetic field at a desired frequency consistent with the numerical analysis conducted at block 414. The resonant mode is generated in the LGR is a substantially uniform electromagnetic field. For example, such an electromagnetic field can be uniform in both phase and amplitude. The uniformity of the electromagnetic field in the inner cavity of the LGR is at least in part due to the geometry of the LGR, namely from the dimensions of the through holes and gaps in the LGR, and in part due to the geometry of the housing, namely from the dimensions of the mounting brackets and the separation region that separates the LGR from the walls of the interior cavity. More specifically, the widths w1 of the mounting brackets and w2 of the separation region aid in creating electromagnetic boundary conditions which suppress the excitation of undesired electromagnetic modes with non-uniform spatial modes. In some embodiments, the undesired modes are shifted to a lower frequency or have a reduced quality (Q) factor as a result of the geometry and dimensions of the housing, guard gap, and mounting brackets of the housing.

The uniform electromagnetic field can then be used for desired applications. For example, in an atomic clock, the uniform electromagnetic field is used to serve as a basis for exciting atoms to an excited state at the resonance frequency, which then serves as a reference for a clock signal.

The methods and techniques described herein may be implemented in part in digital electronic circuitry, or with a programmable processor (for example, a special-purpose processor or a general-purpose processor such as a computer) firmware, software, or in various combinations of each. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instruction to, a data storage system, at least one input device, and at least one output device. Generally, a processor will receive instructions and data from a read-only memory and/or a random-access memory. Storage devices suitable for tangibly embodying computer program instructions and data include all forms of non-volatile memory, including by way of example semiconductor memory devices, such as erasable programmable read-only memory (EPROM), electrically erasable programmable read-only memory (EEPROM), and flash memory devices; magnetic disks such as internal hard disks and removable disks; magneto-optical disks; and the like. Any of the foregoing may be supplemented by, or incorporated in, specially-designed application specific integrated circuits (ASICs).

Example Embodiments

Example 1 includes a device, comprising: a housing coupled to a loop gap resonator (LGR), wherein the LGR includes an inner cavity and is configured to support an electromagnetic field in the inner cavity, wherein the housing comprises: an exterior, and an interior, wherein the interior comprises an interior cavity in which the LGR is disposed therein, wherein the housing comprises at least one mounting bracket protruding into the interior cavity, wherein the at least one mounting bracket has a first width and is configured to fix the LGR in the interior cavity of the housing, wherein the LGR is fixed by the at least one mounting bracket so that there exists a separation region between an outer edge of the LGR and an inner edge of the housing, wherein the separation region has a second width, wherein based on the first width of the at least one mounting bracket, and the second width of the separation region, an electromagnetic field of substantially uniform phase and amplitude is provided in the inner cavity of the LGR.

Example 2 includes the device of Example 1, wherein the separation region comprises free space, a gas, and/or an insulating material.

Example 3 includes the device of any of Examples 1-2, wherein the at least one mounting bracket comprises a plurality of mounting brackets, wherein each of the plurality of mounting brackets has the second width.

Example 4 includes the device of Example 3, wherein each of the plurality of mounting brackets is azimuthally equidistant to a neighboring mounting bracket.

Example 5 includes the device of any of Examples 1-4, wherein the at least one mounting bracket includes a connector that couples to a contact on the LGR.

Example 6 includes the device of any of Examples 1-5, wherein the interior cavity comprises a cylindrical volume.

Example 7 includes the device of any of Examples 1-6, wherein the device forms part of an atomic clock sensor.

Example 8 includes the device of any of Examples 1-7, wherein the first width and the second width is determined from a finite element model.

Example 9 includes the device of any of Examples 1-8, wherein the LGR is configured to receive an electromagnetic signal from a signal generator at a first frequency and to establish the electromagnetic field of substantially uniform phase and amplitude in the inner cavity of the LGR from the electromagnetic signal.

Example 10 includes the device of any of Examples 1-9, wherein the at least one mounting bracket is coupled to the LGR via one or more screws, nuts, or bolts.

Example 11 includes a system, comprising: a signal generator configured to couple an electromagnetic signal in a loop gap resonator (LGR), wherein the LGR includes an inner cavity and is configured to receive the electromagnetic signal and to generate an electromagnetic field in the inner cavity; a housing coupled to the LGR, wherein the housing comprises: an exterior, and an interior, wherein the interior comprises an interior cavity in which the LGR is disposed therein, wherein the housing comprises at least one mounting bracket protruding into the interior cavity, wherein the at least one mounting bracket has a first width and is configured to fix the LGR in the interior cavity of the housing, wherein the LGR is fixed by the at least one mounting bracket so that there exists a separation region between an outer edge of the LGR and an inner edge of the housing, wherein the separation region has a second width, wherein based on the first width of the at least one mounting bracket, and the second width of the separation region, an electromagnetic field of substantially uniform phase and amplitude is provided in the inner cavity of the LGR.

Example 12 includes the system of Example 11, wherein the separation region comprises free space, a gas, and/or an insulating material.

Example 13 includes the system of any of Examples 11-12, wherein the at least one mounting bracket comprises a plurality of mounting brackets, wherein each of the plurality of mounting brackets has the second width.

Example 14 includes the system of Example 13, wherein each of the plurality of mounting brackets is azimuthally equidistant to a neighboring mounting bracket.

Example 15 includes the system of any of Examples 11-14, wherein the at least one mounting bracket includes a connector that couples to a contact on the LGR.

Example 16 includes the system of any of Examples 11-15, wherein the interior cavity comprises a cylindrical volume.

Example 17 includes the system of any of Examples 11-16, comprising a light detection circuit coupled to one or more processors, wherein the light detection circuit receives an electromagnetic signal indicative of an atomic excitation at a resonance frequency of the LGR, wherein the one or more processors are configured to determine a reference clock signal from the electromagnetic signal.

Example 18 includes the system of any of Examples 11-17, wherein the first width and the second width is determined from a finite element model.

Example 19 includes a method, comprising: determining dimensions of at least one mounting bracket and a separation region, wherein the dimensions of the at least one mounting bracket include a first width, wherein the dimensions of the separation region include a second width; fabricating the at least one mounting bracket, wherein the at least one mounting bracket is coupled to a housing and protrudes into an interior cavity of the housing; coupling a loop gap resonator (LGR) to the at least one mounting bracket, wherein the LGR includes an inner cavity and is configured to generate an electromagnetic field in a region of free space in the inner cavity, wherein the LGR is disposed into the interior cavity of the housing such that the second width of the separation region separates the LGR from the housing; inputting an electromagnetic signal into the LGR; and exciting a desired electromagnetic mode at a resonance frequency in the inner cavity of the LGR from the electromagnetic signal.

Example 20 includes the method of Example 19, wherein the separation region comprises free space, a gas, and/or an insulating material.

Although specific embodiments have been illustrated and described herein, it will be appreciated by those of ordinary skill in the art that any arrangement, which is calculated to achieve the same purpose, may be substituted for the specific embodiment shown. Therefore, it is manifestly intended that the claimed invention be limited only by the claims and the equivalents thereof.

What is claimed is:

1. A device, comprising:
a housing coupled to a loop gap resonator (LGR), wherein the LGR includes an inner cavity and is configured to support an electromagnetic field in the inner cavity,
wherein the housing comprises:
an exterior, and
an interior, wherein the interior comprises an interior cavity in which the LGR is disposed therein,
wherein the housing comprises at least one mounting bracket protruding into the interior cavity, wherein the at least one mounting bracket has a first width and is configured to fix the LGR in the interior cavity of the housing,
wherein the LGR is fixed by the at least one mounting bracket so that there exists a separation region between an outer edge of the LGR and an inner edge of the housing, wherein the separation region has a second width,
wherein based on the first width of the at least one mounting bracket, and the second width of the separation region, an electromagnetic field of substantially uniform phase and amplitude is provided in the inner cavity of the LGR.

2. The device of claim 1, wherein the separation region comprises free space, a gas, and/or an insulating material.

3. The device of claim 1, wherein the at least one mounting bracket comprises a plurality of mounting brackets, wherein each of the plurality of mounting brackets has the second width.

4. The device of claim 3, wherein each of the plurality of mounting brackets is azimuthally equidistant to a neighboring mounting bracket.

5. The device of claim 1, wherein the at least one mounting bracket includes a connector that couples to a contact on the LGR.

6. The device of claim 1, wherein the interior cavity comprises a cylindrical volume.

7. The device of claim 1, wherein the device forms part of an atomic clock sensor.

8. The device of claim 1, wherein the first width and the second width is determined from a finite element model.

9. The device of claim 1, wherein the LGR is configured to receive an electromagnetic signal from a signal generator at a first frequency and to establish the electromagnetic field of substantially uniform phase and amplitude in the inner cavity of the LGR from the electromagnetic signal.

10. The device of claim 1, wherein the at least one mounting bracket is coupled to the LGR via one or more screws, nuts, or bolts.

11. A system, comprising:
a signal generator configured to couple an electromagnetic signal in a loop gap resonator (LGR), wherein the LGR includes an inner cavity and is configured to receive the electromagnetic signal and to generate an electromagnetic field in the inner cavity;
a housing coupled to the LGR, wherein the housing comprises:
an exterior, and
an interior, wherein the interior comprises an interior cavity in which the LGR is disposed therein,
wherein the housing comprises at least one mounting bracket protruding into the interior cavity, wherein the at least one mounting bracket has a first width and is configured to fix the LGR in the interior cavity of the housing,
wherein the LGR is fixed by the at least one mounting bracket so that there exists a separation region between an outer edge of the LGR and an inner edge of the housing, wherein the separation region has a second width,
wherein based on the first width of the at least one mounting bracket, and the second width of the separation region, an electromagnetic field of substantially uniform phase and amplitude is provided in the inner cavity of the LGR.

12. The system of claim 11, wherein the separation region comprises free space, a gas, and/or an insulating material.

13. The system of claim 11, wherein the at least one mounting bracket comprises a plurality of mounting brackets, wherein each of the plurality of mounting brackets has the second width.

14. The system of claim 13, wherein each of the plurality of mounting brackets is azimuthally equidistant to a neighboring mounting bracket.

15. The system of claim 11, wherein the at least one mounting bracket includes a connector that couples to a contact on the LGR.

16. The system of claim 11, wherein the interior cavity comprises a cylindrical volume.

17. The system of claim 11, comprising a light detection circuit coupled to one or more processors, wherein the light detection circuit receives an electromagnetic signal indicative of an atomic excitation at a resonance frequency of the LGR, wherein the one or more processors are configured to determine a reference clock signal from the electromagnetic signal.

18. The system of claim 11, wherein the first width and the second width is determined from a finite element model.

19. A method, comprising:
determining dimensions of at least one mounting bracket and a separation region, wherein the dimensions of the at least one mounting bracket include a first width, wherein the dimensions of the separation region include a second width;
fabricating the at least one mounting bracket, wherein the at least one mounting bracket is coupled to a housing and protrudes into an interior cavity of the housing;
coupling a loop gap resonator (LGR) to the at least one mounting bracket, wherein the LGR includes an inner cavity and is configured to generate an electromagnetic field in a region of free space in the inner cavity, wherein the LGR is disposed into the interior cavity of the housing such that the second width of the separation region separates the LGR from the housing;
inputting an electromagnetic signal into the LGR; and
exciting a desired electromagnetic mode at a resonance frequency in the inner cavity of the LGR from the electromagnetic signal.

20. The method of claim 19, wherein the separation region comprises free space, a gas, and/or an insulating material.

* * * * *